(12) United States Patent
Ohira

(10) Patent No.: US 12,159,569 B2
(45) Date of Patent: Dec. 3, 2024

(54) SELF-EMISSIVE ELEMENT PANEL, LED PANEL, AND PLANETARIUM USING SAME

(71) Applicant: Ohira Tech Ltd., Yokohama (JP)

(72) Inventor: Takayuki Ohira, Yokohama (JP)

(73) Assignee: Ohira Tech Ltd., Kanagawa (JP)

( * ) Notice: Subject to any disclaimer, the term of this patent is extended or adjusted under 35 U.S.C. 154(b) by 18 days.

(21) Appl. No.: 17/924,808

(22) PCT Filed: Jul. 2, 2021

(86) PCT No.: PCT/JP2021/025061
§ 371 (c)(1),
(2) Date: May 18, 2023

(87) PCT Pub. No.: WO2022/009789
PCT Pub. Date: Jan. 13, 2022

(65) Prior Publication Data
US 2023/0282152 A1    Sep. 7, 2023

(30) Foreign Application Priority Data

Jul. 8, 2020  (JP) .................................. 2020-117992

(51) Int. Cl.
*G09G 3/32*    (2016.01)
*H01L 27/15*   (2006.01)

(52) U.S. Cl.
CPC ............. *G09G 3/32* (2013.01); *H01L 27/156* (2013.01); *G09G 2300/0452* (2013.01); *G09G 2320/0626* (2013.01); *G09G 2380/00* (2013.01)

(58) Field of Classification Search
None
See application file for complete search history.

(56) References Cited

U.S. PATENT DOCUMENTS

| 7,075,242 B2 | 7/2006 | Miller et al. | |
| 2003/0026564 A1* | 2/2003 | Takeuchi | G02B 26/004 348/E9.012 |
| 2013/0027438 A1* | 1/2013 | Hu | G09G 3/3413 345/690 |
| 2016/0255692 A1* | 9/2016 | Ohira | H05B 45/14 315/210 |

FOREIGN PATENT DOCUMENTS

| JP | 2002258281 A | 9/2002 |
| JP | 2006512732 A | 4/2006 |
| JP | 2006-178340 A | 7/2006 |
| JP | 2015-088412 A | 5/2015 |
| JP | 2022-258281 A | 9/2022 |
| WO | 2004/061963 A1 | 7/2004 |

OTHER PUBLICATIONS

International Search Report for corresponding PCT Application No. PCT/JP2021/025061 mailed Aug. 31, 2021.
Office Action for corresponding Japanese Application No. 2020-117992 dated Dec. 26, 2023.

* cited by examiner

*Primary Examiner* — Ifedayo B Iluyomade
(74) *Attorney, Agent, or Firm* — Wood, Phillips, Katz, Clark & Mortimer

(57) ABSTRACT

An LED panel includes a plurality of LED pixel units being arranged. Each of the plurality of LED pixel units includes: a normal element including a red LED element, a green LED element, and a blue LED element; and a low-luminance element configured to provide an output having luminance lower than the lowest luminance of the normal element.

8 Claims, 8 Drawing Sheets

SELF-EMISSIVE ELEMENT PANEL, LED PANEL, AND PLANETARIUM USING SAME

TECHNICAL FIELD

The present invention relates to a self-emissive element panel, an LED panel, and a planetarium using the same, and more particularly, to a self-emissive element panel and an LED panel each having a high dynamic range, and a planetarium using the same.

BACKGROUND ART

In a related-art planetarium, a projector projects an image of celestial bodies, celestial objects or the like onto a dome-shaped screen. In recent years, as a light source of the projector, a light emitting diode (LED) is increasingly used to replace a conventional electric lamp or a discharge lamp.

Further, in the planetarium, in addition to projection of celestial bodies by the projector, lighting for the interior at the time of entrance and exit of audience and lighting for daytime and night scenes are performed. In particular, a slight change in brightness during shift from evening to night is produced by a gradual change in brightness of lighting.

An LED is increasingly used also as a light source for those kinds of lighting. Light of an LED is commonly controlled by pulse width modulation (PWM) control. In PWM control, the brightness of an LED is specified by a pulse width of a PWM signal provided by a digital circuit.

However, the brightness of an LED, unlike that of an incandescent lamp, is accurately proportional to a pulse width of a PWM signal. For this reason, light control of an LED by PWM control causes a problem in that the brightness of the LED seems to change in steps especially in a low luminance range. For example, a PWM signal with 12-bit resolution has a pulse width of $1/4{,}096$ at the minimum brightness level. Then, at the brightness level increased by one level, the PWM signal has a pulse width of $2/4{,}096$, that is, the brightness is doubled. As a result, in an area with low luminance, it seems that the brightness changes in steps.

Further, human eyes can fully recognize even the brightness of the minimum pulse width, and hence there is caused a problem in that lighting seems to go out suddenly from the brightness of the minimum pulse width, during fade-out.

One possible solution to the above-mentioned problems is to increase the PWM bit resolution. However, to increase bit resolution necessitates high-speed switching of a current to cope with a small pulse width. As a result, noises are more liable to occur, and susceptibility to extremal noises is increased. Especially in an area with a small amount of light, flickers occur due to extremal noises, or brightness changes, in some cases.

In view of this, in JP 2015-088412 A, in order to obtain a smooth change in luminance of an LED, the LED is connected to a drive circuit including a plurality of current limiting circuits and pulse-width modulation circuits through each of which current having different predetermined current set values flows, and a pulse width of the circuit through which the current having a low current set value flows is mainly controlled for lower luminance range while a pulse width of the circuit through which the current having a high current set value flows is mainly controlled for higher luminance range.

SUMMARY OF INVENTION

In the related-art planetarium, a projector projects an image of celestial bodies onto a dome-shaped screen. In contrast thereto, there has been proposed a planetarium in which LED panels placed on an entire inner surface of a dome displays celestial bodies.

In the planetarium in which an image of celestial bodies is projected, audience visually observes the image of celestial bodies which is formed by the light projected onto the dome-shaped screen and diffusely reflected from the screen surface. In contrast thereto, in the planetarium in which the LED panels are placed, audience visually observes directly LED elements displaying an image of celestial bodies. Thus, the planetarium in which LED panels are placed can display a very sharp image of celestial bodies.

In the real night sky, there exist celestial bodies ranging from a bright celestial body such as the moon and the fixed stars to a dark celestial body such as a star in the Milky Way. The brightness of a dark celestial body such as a star in the Milky Way is only approximately several millionths of the brightness of a bright celestial body. Thus, in order to faithfully reproduce a night sky in a planetarium, the LED panel is required to have a dynamic range that is by far higher than a dynamic range required for an LED panel that displays an ordinary television image or the like.

However, the luminance of an LED panel implemented by a 12-bit resolution PWM signal achieves only 4,096 levels of gray scale, and even the luminance of an LED panel implemented by a 16-bit resolution PWM signal achieves only 65,536 levels of gray scale. Thus, it is difficult to realistically display celestial bodies ranging from a bright celestial body such as planets to a dark celestial body such as a star in the Milky Way by only placing the related-art LED panels on the entire inner surface of the dome. In particular, unlike in the case of the projection-type planetarium, audience directly observes LED panels, and hence the brightness is too much even at the lowest luminance of LED elements, which makes it difficult to realistically display a dark celestial body.

The same applies to not only an LED but also display panels using other self-emissive elements such as an organic EL element.

The present invention has been devised in view of the above-mentioned situations, and an object thereof is to provide a self-emissive element panel and an LED panel each having a high dynamic range, and a planetarium using the same.

According to one embodiment of the present invention, there is provided a self-emissive element panel including a plurality of self-emissive pixel units being arranged, wherein each of the plurality of self-emissive pixel units includes: a normal element including a red element including a self-emissive element, a green element including a self-emissive element, and a blue element including a self-emissive element; and a low-luminance element configured to provide an output having luminance lower than the lowest luminance of the normal element.

Further, according to one embodiment of the present invention, there is provided a planetarium including the self-emissive element panel or an LED panel according to one embodiment of the present invention, wherein the self-emissive element panel or the LED panel is placed on an entire inner surface of a dome.

As described above, in the self-emissive element panel, the LED panel, and the planetarium according to one embodiment of the present invention, each of the pixel units forming the panel is provided with the low-luminance element in addition to the normal element.

Further, when an attention is paid to the fact that a human can hardly perceive colors at low illuminances while human eyes have a considerably wide dynamic range for brightness, the low-luminance element may be formed of a white element. This allows the low-luminance element to be implemented by a single kind of element, that is, only a white element. As a result, cost for a panel can be reduced as compared to a case in which the low-luminance element is formed of respective elements of the three primary colors.

According to the present invention, the self-emissive element panel and the LED panel each having a high dynamic range, and the planetarium using the same can be provided.

DESCRIPTION OF EMBODIMENTS

An LED panel and a planetarium according to an embodiment of the present invention are described with reference to the drawings.

Figure 1:
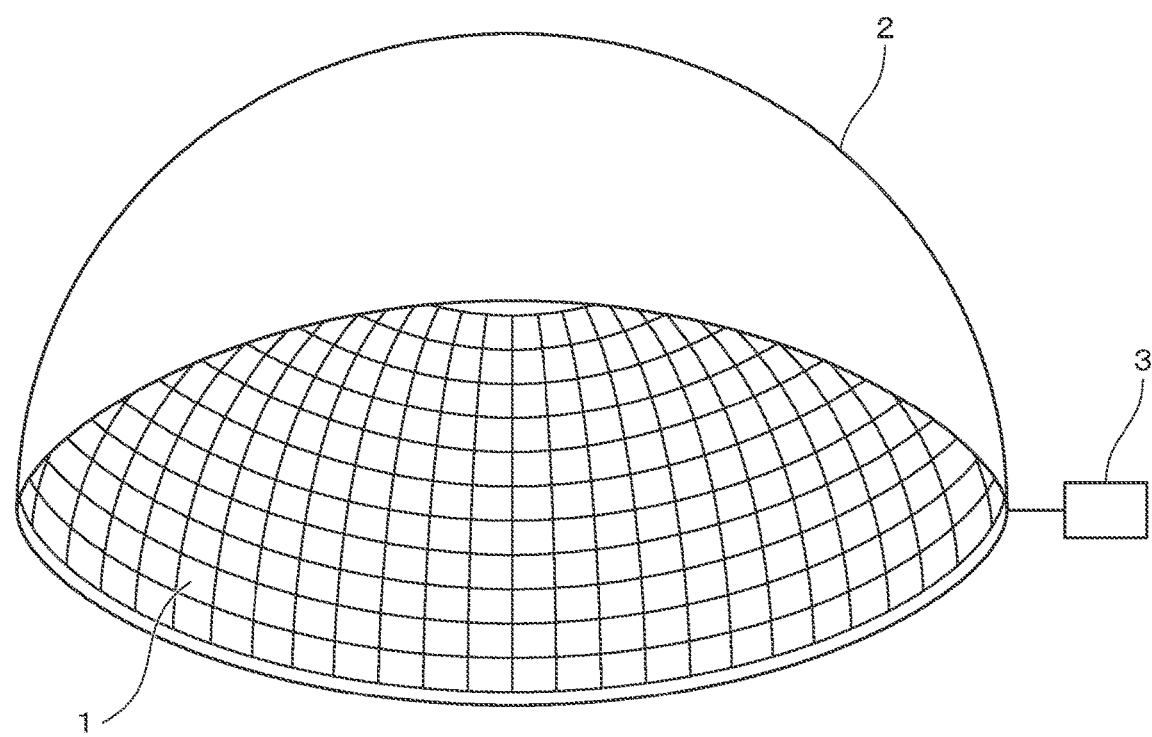
FIG. 1 is a schematic view of the inside of a dome of a planetarium according to an embodiment of the present invention as seen from below.

FIG. 1 is a schematic view of a planetarium according to an embodiment of the present invention. In the planetarium according to this embodiment, no optical star projector is present in the center of a dome 2, and LED panels 1 are placed on the entire inner surface of the dome 2. Each of the LED panels 1 is driven by an LED drive circuit 3.

FIG. 1 schematically shows an example in which the LED panels 1 are arranged along longitude lines and latitude lines to form a grid pattern, but the shape and arrangement of the LED panels 1 are not limited to those. Further, the surface of the individual LED panel 1 may be flat, but preferably, is curved in accordance with the curvature of the dome 2.

Figure 2:
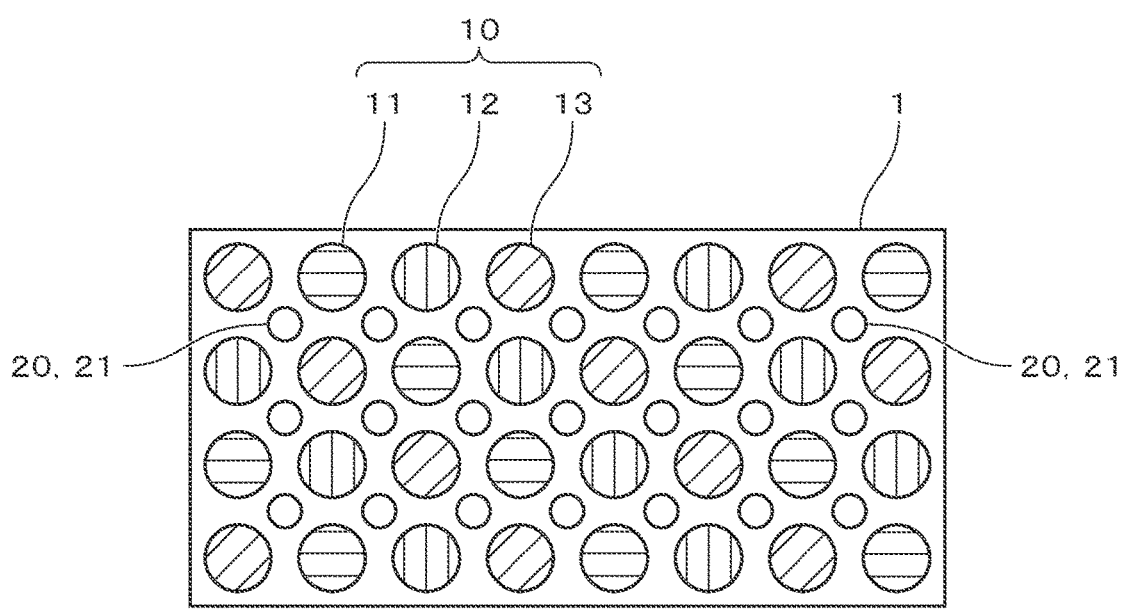
FIG. 2 is a schematic view for illustrating an example of an arrangement pattern of LED elements in an LED panel according to the embodiment of the present invention.

FIG. 2 shows an example of an arrangement pattern of LED elements in the LED panel 1. As illustrated in FIG. 2, in the LED panel 1, a plurality of LED pixel units are arranged. Each of the plurality of LED pixel units includes a normal element 10 including a red LED element 11, a green LED element 12, and a blue LED element 13, and a low-luminance element 20 for providing an output having luminance lower than the lowest luminance of the normal element 10. The low-luminance element 20 includes a white LED element 21.

In FIG. 2, the red LED element 11 is schematically represented by a circle with horizontal lines, the green LED element 12 is schematically represented by a circle with vertical lines, and the blue LED element 13 is schematically represented by a circle with oblique lines. Further, the white LED element 21 is schematically represented by an open circle. Moreover, FIG. 2 shows each of the low-luminance elements 20 in a size smaller than each of the normal elements 10, but the size of the low-luminance element 20 is not limited to that.

Further, in FIG. 2, the low-luminance elements 20 are placed between the normal elements (11, 12, 13) arranged in matrix. More specifically, the LED element of any color among the normal elements (11, 12, 13) and the white LED element 21 of the low-luminance element 20 are alternately arranged along an oblique direction of FIG. 2, and a row of LED elements of any colors among the normal elements (11, 12, 13) and a row of the white LED elements 21 are alternately arranged along the vertical direction and the horizontal direction of FIG. 2.

FIG. 2 shows the example in which the normal elements 10 are arranged in a grid pattern and the normal element 10 and the low-luminance element 20 are alternately arranged, but the arrangement pattern of the normal elements 10 and the low-luminance elements 20 is not limited to that. Further, the normal element 10 may include not only the red LED element 11, the green LED element 12, and the blue LED element 13, but also an element of a different color, such as a white element or a yellow element, for example.

It is preferred that the lowest luminance of each of the white LED elements 21 forming the low-luminance element 20 be equal to or less than $1/100$ of the lowest luminance of each of the red LED element 11, the green LED element 12, and the blue LED element 13 forming the normal element 10. This enables realistic expression of also a dark celestial body such as a star in the Milky Way with the LED panels 1 in a planetarium.

As described above, each of the LED pixel units forming the LED panel 1 is provided with the low-luminance element 20 (21), in addition to the normal element 10 (11, 12, 13).

Here, the low-luminance element 20 is formed of a single kind of element, that is, only the white LED element 21. This is because a human vision can hardly perceive colors at low illuminances while human eyes have a considerably wide dynamic range for brightness. For example, the Milky Way, which is actually a group of celestial bodies in various colors, looks whitish to human eyes. Thus, by forming the low-luminance element 20 of a single kind of element, that is, only the white LED element 21, it is possible to reduce cost for an LED panel as compared to a case in which the low-luminance element 20 is formed of respective LED elements of the three primary colors.

Figure 3:
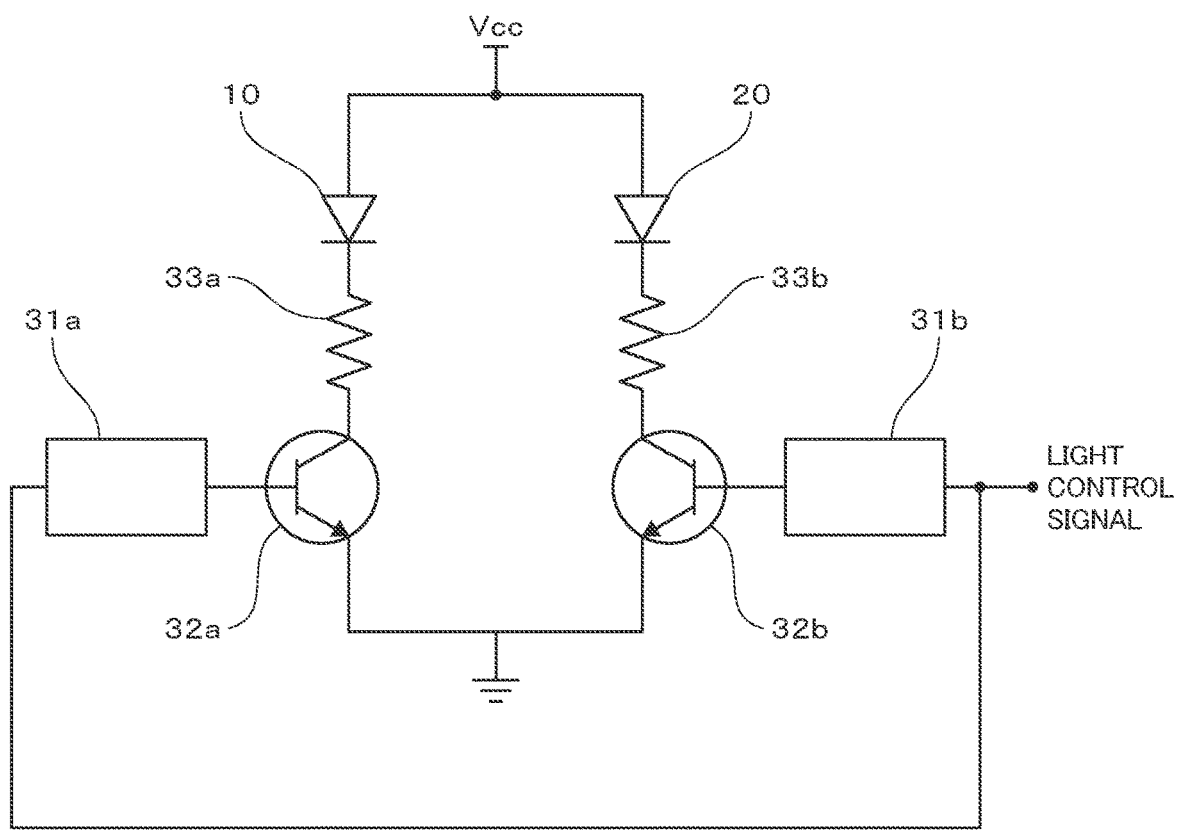
FIG. 3 is a circuit diagram for illustrating an example of a drive circuit of the LED panel.

FIG. 3 shows an example of the drive circuit of the LED panel 1. As illustrated in FIG. 3, the drive circuit includes a first PWM signal generator 31a for the normal element 10 and a second PWM signal generator 31b for the low-luminance element 20.

A PWM signal output from the first PWM signal generator 31a performs switching on a switching element 32a connected in series to the normal element 10. Meanwhile, a PWM signal output from the second PWM signal generator 31b performs switching on a switching element 32b connected in series to the low-luminance element 20. In the example illustrated in FIG. 3, the switching elements 32a and 32b include PNP transistors. The switching elements 32a and 32b are not limited to PNP transistors, and may include TFTs, for example.

The drive circuit further includes a limiting resistor 33a connected in series to the normal element 10 and a limiting resistor 33b connected in series to the low-luminance element 20. By setting the resistance value of the limiting resistor 33b connected in series to the low-luminance element 20 to, for example, 1,000 times the resistance value of the limiting resistor 33a connected in series to the normal element 10, it is possible to make a drive current flowing through the low-luminance element 20 equal to 1/1,000 of a drive current flowing through the normal element 10 for the same pulse width of a PWM control signal. As a result, the luminance of the low-luminance element 20 can be made much lower than the luminance of the normal element 10.

Further, the second PWM signal generator 31b for the low-luminance element 20, in a low-luminance range in particular, outputs a PWM control signal having a pulse width smaller than a pulse width of a PWM control signal output from the first PWM signal generator 31a, in response to the same light-control command value.

Figure 4:
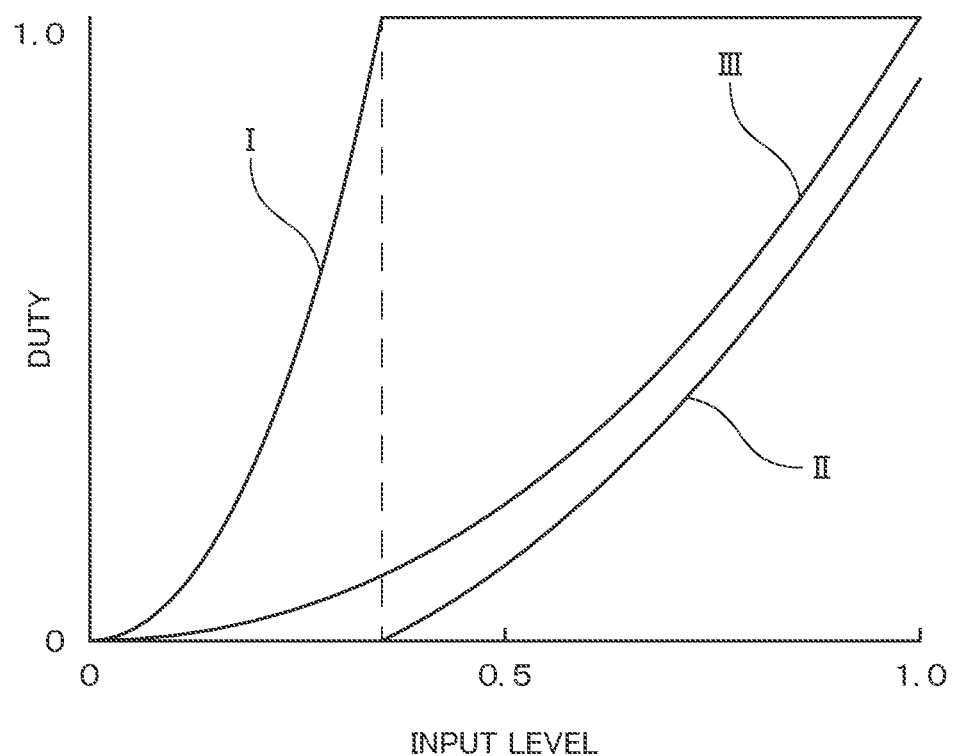
FIG. 4 is a graph for showing an example of a pulse width of a PWM control signal versus a light-control command value.

The graph of FIG. 4 shows an example of a duty of each of PWM control signals output from the first and second PWM signal generators 31a and 31b, with respect to an input level of a light control signal. The horizontal axis of the graph of FIG. 4 represents an input level having a maximum value of 1.0, and the vertical axis represents a duty of a PWM control signal. A curve I in the graph of FIG. 4 represents a duty of a PWM control signal output from the second PWM signal generator 31b with respect to the input level of the light control signal. A curve II represents a duty of a PWM control signal output from the first PWM signal generator 31a with respect to the input level of the light control signal.

In a low-luminance range (at an input level of 0.35 or lower, for example), as indicated by the curve I, as the input level increases from 0, first, the duty of a PWM signal output from the second PWM signal generator 31b for the low-luminance element 20 increases from 0 to 1.0. Thus, in the low-luminance range, while the light is turned out in the normal element 10, only the low-luminance element 20 is subjected to light control. Accordingly, light control in the low-luminance range is smoothly performed as schematically indicated by a curve III in the graph.

Subsequently, when the duty becomes equal to 1.0 and the low-luminance element 20 has the highest luminance, next, the duty of a PWM signal output from the first PNM signal generator 31a for the normal element 10 increases as the input level further increases, as indicated by the curve II. Consequently, as schematically indicated by the curve III in the graph, light control of the LED panel is smoothly performed in a range from the low-luminance range to the highest luminance.

As described above, the normal element 10 and the low-luminance element 20 are driven by the PWM signal generators 31a and 31b separate from each other, respectively, and hence the luminance of the low-luminance element 20 is much lower than the luminance of the normal element 10. As a result, an LED panel having a high dynamic range and a planetarium using the LED panel can be provided.

In the meantime, in the example illustrated in FIG. 2 and FIG. 3, the element luminance of the low-luminance element 20 is reduced by reduction of the drive current of the low-luminance element 20 as compared to the drive current of the normal element 10. In this case, because of extreme weakness of the drive current of the low-luminance element 20, a circuit substrate is required to have a high insulating property and is liable to be affected by current leakage caused due to deterioration of insulation over time.

In view of this, an example in which the element luminance of the low-luminance element 20 is reduced without reduction of the drive current of the low-luminance element 20 to an extremely weak current, is described.

Figure 5A:
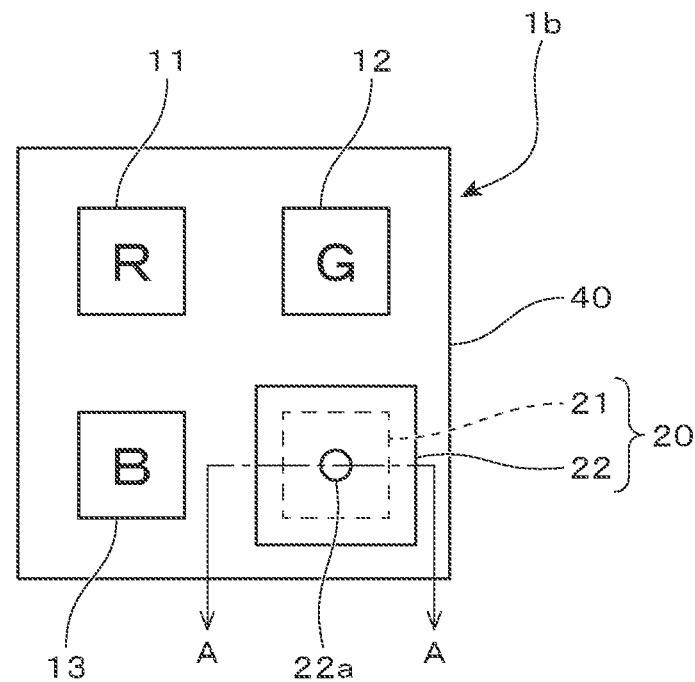
FIG. 5A shows an example of an LED pixel unit forming the LED panel and is a plan view of the LED pixel unit.
Figure 5B:
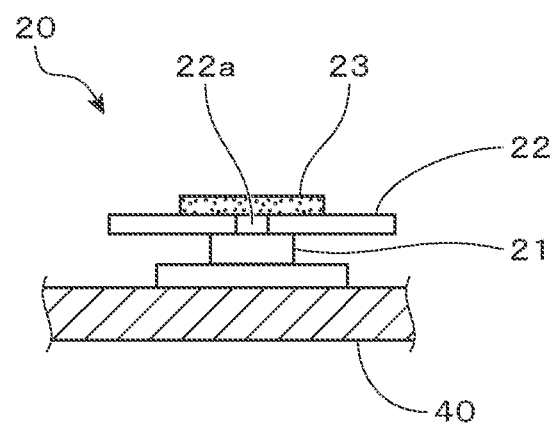
FIG. 5B shows an example of the LED pixel unit forming the LED panel and is a sectional view taken along the line A-A of FIG. 5A.

FIG. 5A and FIG. 5B show an example of an LED pixel unit 1b forming the LED panel 1. As illustrated in FIG. 5A, in the LED pixel unit 1b, the red LED element 11, the green LED element 12, and the blue LED element 13 forming the normal element 10, and the low-luminance element 20 are placed on a rectangular substrate 40 such that each kind of element is present alone. The contour of the LED pixel unit 1b is not limited to a rectangle. A positional relationship among the LED elements 11 to 13 and the low-luminance element 20 and the respective contour shapes of the elements are not limited to those. The number of LED elements of each color forming the LED pixel unit is not limited to one. A proportion of the number of LED elements of each color is not limited to that. The same applies to an example illustrated in FIG. 6A and FIG. 6B.

As illustrated in FIG. 5B, in the LED pixel unit 1b, the low-luminance element 20 includes the white LED element 21, a pinhole plate 22 placed on the white LED element 21, and a diffusion plate 23 covering a pinhole 22a of the pinhole plate 22. The diffusion plate 23 is omitted in FIG. 5A.

By attenuating light of the low-luminance element 20 by using the pinhole plate 22, it is possible to sufficiently reduce the luminance of the low-luminance element 20 even when the white LED element 21 is driven with a drive current at a level similar to that of the drive current of the red LED element 11, the green LED element 12, and the blue LED element 13 of the normal element 10. Consequently, a high dynamic range can be achieved without reduction of the drive current of the low-luminance element 20 to an extremely weak current.

Figure 6A:
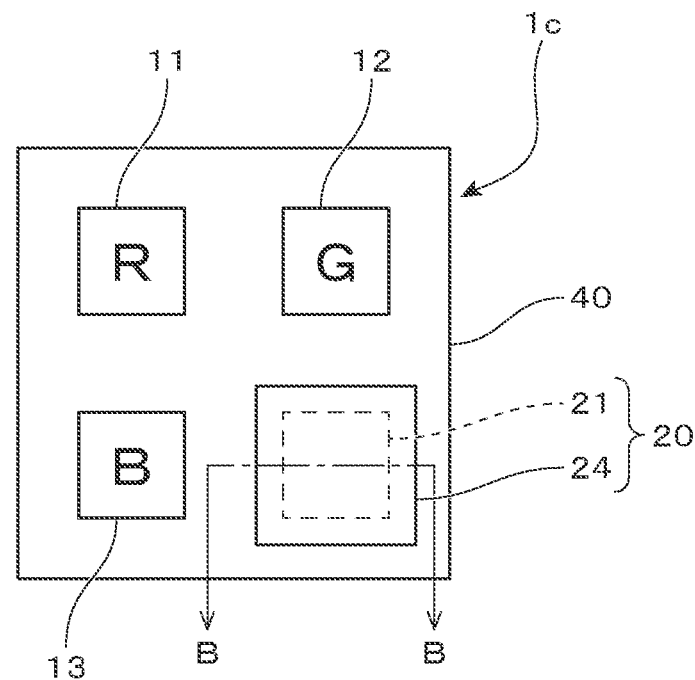
FIG. 6A shows another example of the LED pixel unit forming the LED panel and is a plan view of the LED pixel unit.
Figure 6B:
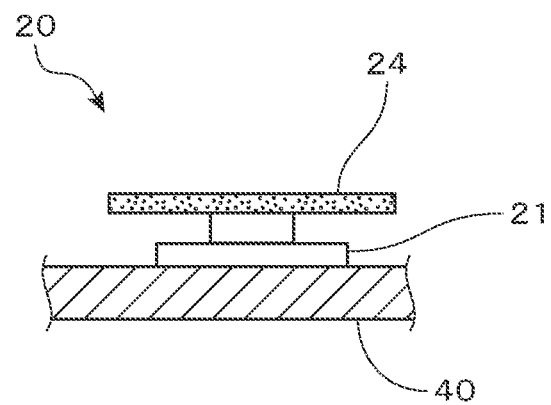
FIG. 6B shows another example of the LED pixel unit forming the LED panel and is a sectional view taken along the line B-B of FIG. 6A.

Further, FIG. 6A and FIG. 6B show another example of an LED pixel unit 1c forming the LED panel 1. As illustrated in FIG. 6A, in the LED pixel unit 1c, the red LED element 11, the green LED element 12, and the blue LED element 13 forming the normal element 10, and the low-luminance element 20 are placed on the rectangular substrate 40.

As illustrated in FIG. 6B, in the LED pixel unit 1c, the low-luminance element 20 includes the white LED element 21 and a light attenuation filter film 24 placed on the white LED element 21. As another example, the LED pixel unit 1c may be entirely covered with a filter sheet partially provided with a light attenuation portion such that the light attenuation portion is positioned on the white LED element 21 of the low-luminance element 20.

By attenuating light of the low-luminance element 20 by using the light attenuation filter film 24, it is possible to sufficiently reduce the luminance of the low-luminance element 20 even when the white LED element 21 is driven with a drive current at a level similar to that of the drive current of the red LED element 11, the green LED element 12, and the blue LED element 13 of the normal element 10. Consequently, a high dynamic range can be achieved without reduction of the drive current of the low-luminance element 20 to an extremely weak current.

Light attenuation means such as the pinhole plate 22 described with reference to FIG. 5A and FIG. 5B or the light attenuation filter film 24 described with reference to FIG. 6A and FIG. 6B and a drive circuit that reduces a drive current, such as the circuit described with reference to FIG. 3, may be used in combination.

Figure 7:
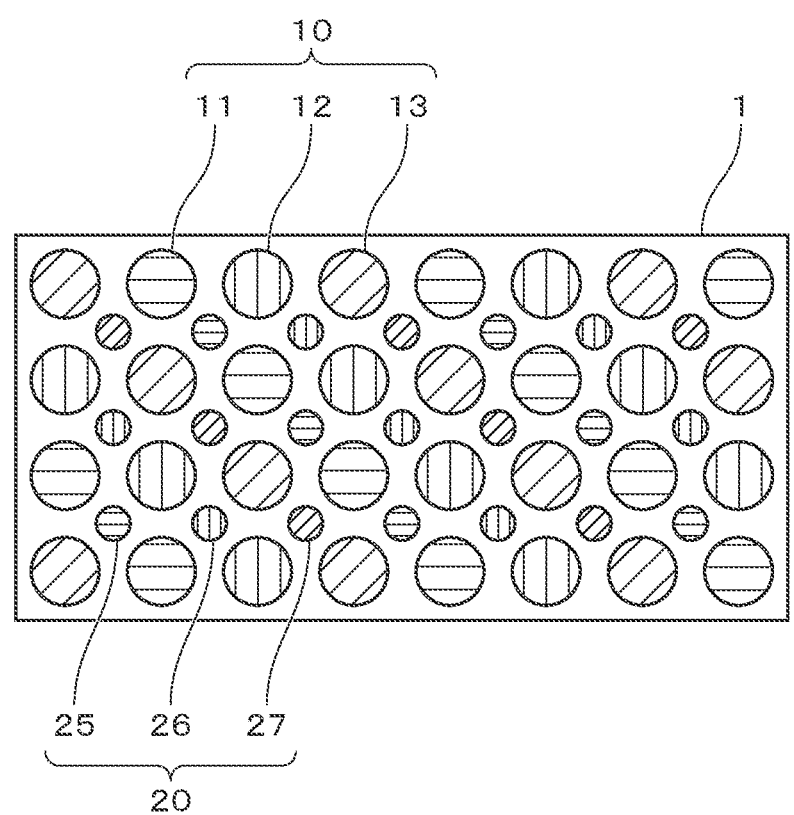
FIG. 7 is a schematic view for illustrating an example of an arrangement pattern of LED elements in an LED panel according to another embodiment of the present invention.

Further, the embodiment described above has shown the example in which the white LED element 21 is used for the low-luminance element 20, but the low-luminance element is not limited to that. The low-luminance element 20 also may include LED elements of the three primary colors. Specifically, as illustrated in FIG. 7, the low-luminance element 20 may include a red low-luminance LED element 25, a green low-luminance LED element 26, and a blue low-luminance LED element 27. To include the three primary colors also in the low-luminance element 20 enables high color reproducibility in display even in the low luminance range. Further, the low-luminance element 20 may include not only the red low-luminance LED element 25, the green low-luminance LED element 26, and the blue low-luminance LED element 27, but also elements of other colors, such as a white element and a yellow element, for example.

Each of the red low-luminance LED element 25, the green low-luminance LED element 26, and the blue low-luminance LED element 27 can be driven by the circuit described with reference to FIG. 3, in the same manner as in the embodiment described above, for example.

Further, also in the case in which the low-luminance element 20 includes three-color LED elements for low luminance, the low-luminance element 20 may have a configuration in which a light attenuation filter film is provided as described with reference to FIG. 6A and FIG. 6B. In other words, the LED panel may have a configuration illustrated in FIG. 8, for example. On the substrate 40, a high-luminance row 46 and a low-luminance row 47 are alternately provided. In the high-luminance row 46, the red LED element 11, the green LED element 12, and the blue LED element 13 are arranged.

In the low-luminance row 47, a low-luminance red LED element 41, a low-luminance green LED element 42, and a low-luminance blue LED element 43 are arranged. Thus, each pair of the red LED element 11 and the low-luminance red LED element 41, the green LED element 12 and the low-luminance green LED element 42, and the blue LED element 13 and the low-luminance blue LED element 43 forms one group 45, and the elements in each group are placed side by side. A filter sheet 50 is provided so as to cover those LED elements. In the filter sheet 50, a transparent film 51 is provided at a portion corresponding to the high-luminance row 46, and a light attenuation filter film 52 is provided at a portion corresponding to the low-luminance row 47.

Figure 8:
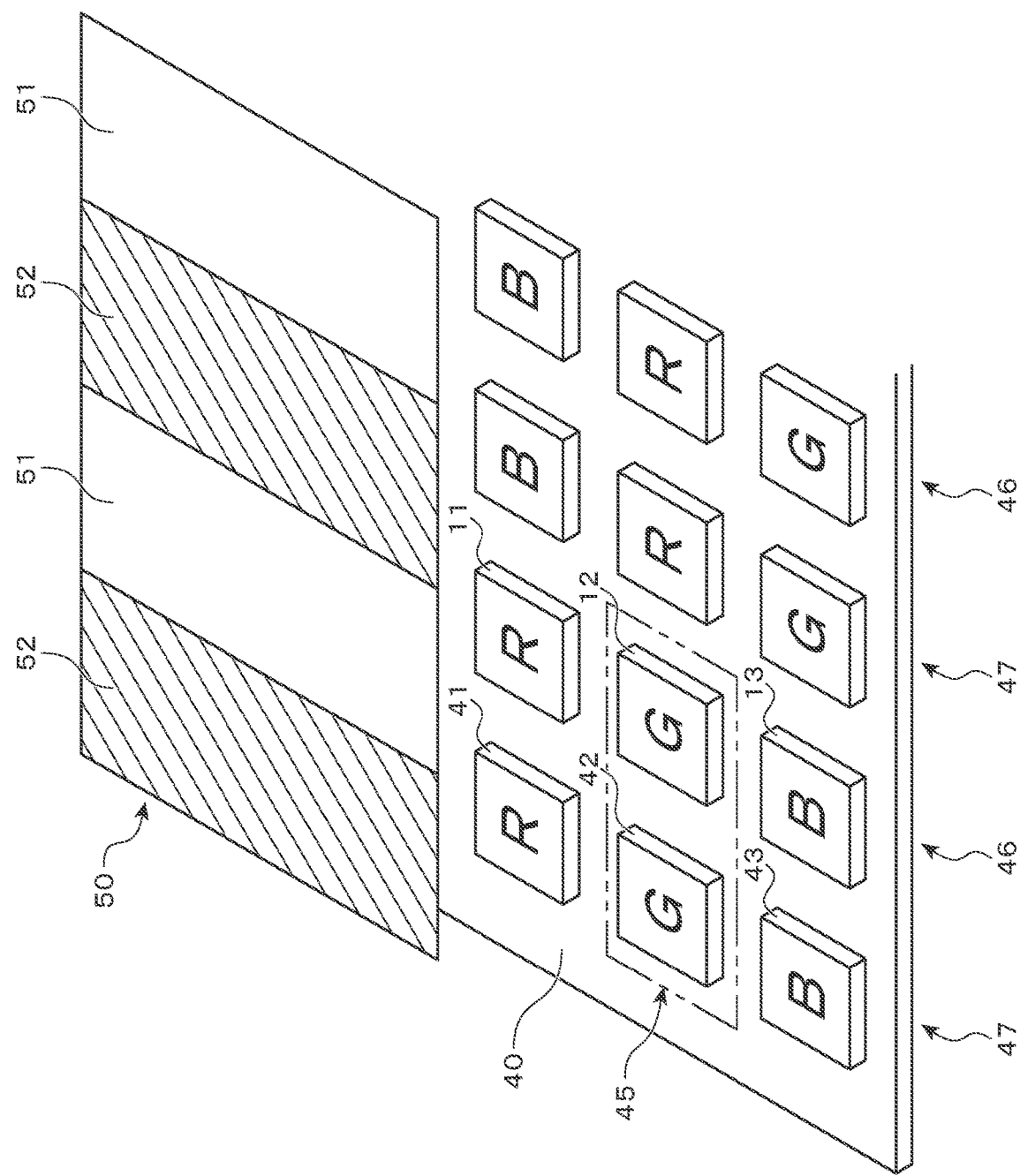
FIG. 8 is an exploded perspective view for schematically illustrating another configuration example of the LED panel.

As described above, the low-luminance element 20 may be implemented by a configuration in which the red LED element 11, the green LED element 12, and the blue LED element 13, and the low-luminance red LED element 41, the low-luminance green LED element 42, and the low-luminance blue LED element 43 are formed so as to emit light at similar luminance, and the light attenuation filter film 52 is provided, for example. The arrangement of the respective elements illustrated in FIG. 8 is one example, and the arrangement can be changed as appropriate.

As another example, the low-luminance element 20 may be implemented by the use of the drive circuit that uses a current-setting resistor having a high resistance value as described with reference to FIG. 3 in driving the low-luminance red LED element 41, the low-luminance green LED element 42, and the low-luminance blue LED element 43, to reduce the light-emission luminance of the elements, and by light attenuation by using the light attenuation filter film 52.

Further, instead of using the light attenuation filter film 52, light attenuation may be performed by using a pinhole as described with reference to FIG. 5A and FIG. 5B.

The preferred embodiment of the present invention is described above, but the present invention is not limited to the embodiment described above. It should be understood that various modifications can be made within the scope of the present invention.

For example, the embodiment described above has given description by taking as an example an LED panel using an LED element, but the above-mentioned technology can be widely applied to a self-emissive element panel using a self-emissive element such as an organic electro-luminescence (EL) element (OLED element), in addition to an LED element, in the same manner.

For example, in an organic EL element panel using an organic EL element, a normal element including a red element, a green element, and a blue element may be formed by using light emission layers that have different emission colors, such as a red light emission layer, a green light emission layer, and a blue light emission layer, respectively. As another example, the normal element may be formed by using a white light emission layer and a color filter. Moreover, also for the low-luminance element for providing an output having luminance lower than the lowest luminance of the normal element, light emission layers that have different emission colors, such as a red light emission layer, a green light emission layer, and a blue light emission layer, may be used, or a white organic EL element that is a white self-emissive element may be used.

Further, the embodiment described above has shown the example in which the LED panels are placed on the entire inner surface of the dome of the planetarium, but application of the self-emissive element panel or the LED panel according to the present invention is not limited to a planetarium. For example, the panels can also be applied to a system for performing other display. Specifically, the display surface is not always required to be provided on the inner surface of the dome 2, and the display surface may be a flat surface or the like. Further, a displayed image is not limited to a starry sky or the like, and any kind of image can be displayed. For example, the panels may be used for a large signage display having a flat display surface on which advertisements or the like are displayed.

The invention claimed is:

1. A self-emissive element panel, comprising a plurality of self-emissive pixel units being arranged,
   wherein each of the plurality of self-emissive pixel units includes:
      a normal element including:
         a red element including a self-emissive element,
         a green element including a self-emissive element, and
         a blue element including a self-emissive element; and
      a low-luminance element configured to provide an output having luminance lower than the light-controllable lowest luminance of the normal element, and
   wherein a light-controllable lowest luminance of the low-luminance element is equal to or lower than $1/100$ of the light-controllable lowest luminance of the normal element.

2. An LED panel, comprising a plurality of LED pixel units being arranged,
   wherein each of the plurality of LED pixel units includes:
      a normal element including:
         a red LED element,
         a green LED element, and
         a blue LED element; and
      a low-luminance element configured to provide an output having luminance lower than the light-controllable lowest luminance of the normal element, and
   wherein a light-controllable lowest luminance of the low-luminance element is equal to or lower than $1/100$ of the light-controllable lowest luminance of the normal element.

3. The LED panel according to claim 2, wherein the low-luminance element includes a white LED element.

4. The LED panel according to claim 2, wherein the low-luminance element includes a red LED element, a green LED element, and a blue LED element.

5. The LED panel according to claim 2, wherein the low-luminance element is configured to provide an output having luminance lower than luminance of the normal element in response to a drive current having the same magnitude as a magnitude of a drive current applied to the normal element.

6. The LED panel according to claim 2, wherein the low-luminance element includes light attenuation element.

7. A planetarium, comprising the self-emissive element panel of claim 1,
   wherein the self-emissive element panel or the LED panel is placed on an entire inner surface of a dome.

8. The planetarium according to claim 7, wherein the self-emissive element panel is an LED panel.

* * * * *